(12) United States Patent
Switzer et al.

(10) Patent No.: US 10,524,400 B2
(45) Date of Patent: Dec. 31, 2019

(54) COMPONENT LOCATING APPARATUS AND METHOD FOR ALIGNMENT OF COMPONENTS ON OPPOSITE SIDES OF A STRUCTURAL WALL

(71) Applicant: THE BOEING COMPANY, Chicago, IL (US)

(72) Inventors: Steve Duane Switzer, St. Charles, MO (US); Brett Allen Hansen, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 92 days.

(21) Appl. No.: 15/837,126

(22) Filed: Dec. 11, 2017

(65) Prior Publication Data

US 2019/0182998 A1    Jun. 13, 2019

(51) Int. Cl.
*H05K 13/04* (2006.01)
*H01F 7/02* (2006.01)
*G01D 5/12* (2006.01)

(52) U.S. Cl.
CPC ............. *H05K 13/04* (2013.01); *G01D 5/12* (2013.01); *H01F 7/021* (2013.01)

(58) Field of Classification Search
CPC ........... H05K 13/04; G01D 5/12; H01F 7/021

USPC ....................................... 324/207.13; 385/15
See application file for complete search history.

(56) References Cited

U.S. PATENT DOCUMENTS 8,774,577 B2 * 7/2014 Benjamin ............ G02B 6/3886
385/15

* cited by examiner

*Primary Examiner* — Farhana A Hoque
(74) *Attorney, Agent, or Firm* — Jay J. Hoette; The Small Patent Law Group LLC

(57) ABSTRACT

A component locating apparatus for alignment of components on opposite sides of a structural wall includes a source magnet and a clone magnet. The source magnet has a magnetic centroid positioned relative to a locating feature and is successively held against the first side of the structural wall at a plurality of spaced apart source positions. The clone magnet has a marking opening at a magnetic centroid and is magnetically held against the second side of the structural wall by an attractive magnetic force at clone positions corresponding to the source positions. The magnetic centroids are aligned by the attractive magnetic force and the marking opening allows an operator to mark the second side of the structural wall at the magnetic centroid of the clone magnet at each of the clone positions to mirror, on the second side, the source positions corresponding to the component locating template.

24 Claims, 4 Drawing Sheets

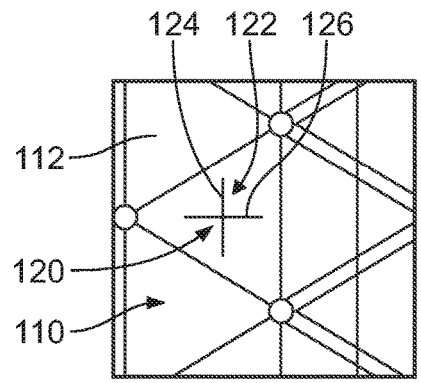
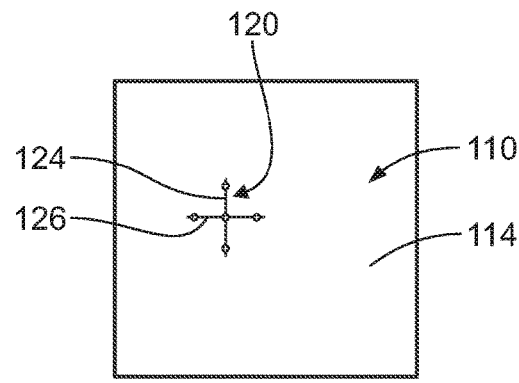
FIG. 3  FIG. 4
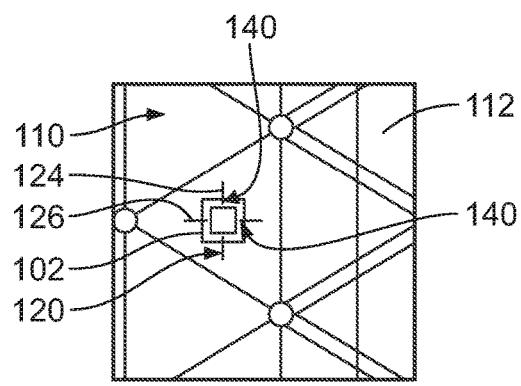
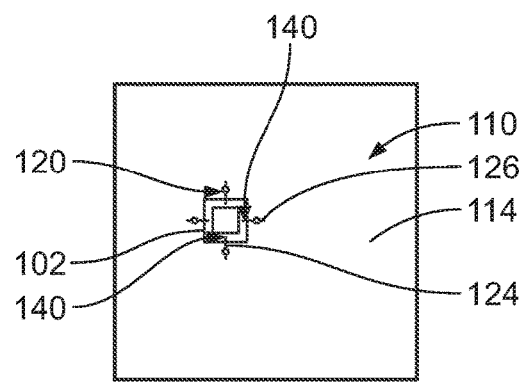
FIG. 5  FIG. 6
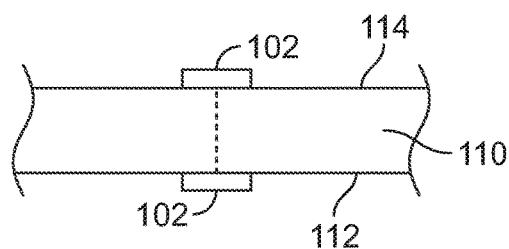
FIG. 7

COMPONENT LOCATING APPARATUS AND METHOD FOR ALIGNMENT OF COMPONENTS ON OPPOSITE SIDES OF A STRUCTURAL WALL

GOVERNMENT LICENSE RIGHTS

This invention was made with government support under Contract NNM07AB03C, awarded be National Aeronautics and Space Administration (NASA). The government has certain rights in the invention.

BACKGROUND

The subject matter herein relates generally to a component locating apparatus and a method for alignment of components on opposite sides of a structural wall.

In some systems, it may be desirable to accurately position components on opposite sides of a structural wall or panel. For example, sensors may need to be accurately positioned on opposite sides of a structural wall for sensing characteristics of the structural wall. For example, strain gages, temperature sensors, position sensors and the like may need to be positioned on opposite sides of the structural wall, such as to monitor the interior surface and the exterior surface of the structural wall at the same location on the structural wall. Locating the component on one side may be simple, such as when the location of the first component is irrelevant, only that the second component be directly aligned with the first component. In other applications, one side of the wall may have an identifiable mounting location, such as relative to other parts of the structural wall or by premade mounting locations or a mounting guide located on the first side. However, accurate alignment of the second component may be difficult. For example, the second side may not include the same identifiable mounting locations. The features on the second side may be different or nonexistent. Additionally, the mounting locations may be relatively far from any identifiable feature or edge and measuring such long distances using a tape measure or scale induces errors in locating the mounting location. Thus, a need exists for a component locating apparatus that may be used to align components mounted on opposite sides of a structural wall.

BRIEF DESCRIPTION

In one embodiment, a component locating apparatus is provided for alignment of components to be mounted on opposite sides of a structural wall having a first side and a second side opposite the first side that includes a component locating template for locating at least one component on the first side. The component locating apparatus includes a source magnet and a clone magnet. The source magnet includes a locating feature. The source magnet is a rare earth magnet. The source magnet has a magnetic centroid positioned at a predetermined location relative to the locating feature. The source magnet has an first side configured to be successively held against the first side of the structural wall at a plurality of spaced apart source positions relative to the component locating template. The locating feature is used to locate the source magnet at the spaced apart source positions. The clone magnet has a magnetic centroid and a marking opening at the magnetic centroid of the clone magnet. The clone magnet is a rare earth magnet. The clone magnet has an first side configured to be magnetically held against the second side of the structural wall by an attractive magnetic force of the source magnet at a plurality of clone positions corresponding to the plurality of source positions. The magnetic centroid and the marking opening of the clone magnet are aligned with the magnetic centroid of the source magnet by the attractive magnetic force. The marking opening allows an operator to mark the second side of the structural wall at the magnetic centroid of the clone magnet at each of the clone positions to mirror, on the second side, the source positions corresponding to the component locating template.

In another embodiment, a method is provided for alignment of components to be mounted on opposite sides of a structural wall having a first side and a second side opposite the first side that includes a component locating template for locating at least one component on the first side. The method includes successively holding a source magnet at a plurality of spaced apart source positions relative to the component locating template on the first side of the structural wall. The source magnet has a locating feature and a magnetic centroid positioned at a predetermined location relative to the locating feature. The locating feature is used to locate the source magnet at the spaced apart source positions. The method includes successively positioning a clone magnet at a plurality of clone positions on the second side of the structural wall corresponding to the plurality of source positions using an attractive magnetic force of the source magnet. The clone magnet has a magnetic centroid and a marking opening at the magnetic centroid of the clone magnet. The magnetic centroid and the marking opening of the clone magnet are aligned with the magnetic centroid of the source magnet by the attractive magnetic force. The method includes marking each of the plurality of clone positions on the second side of the structural wall through the marking opening at the magnetic centroid of the clone magnet to mirror, on the second side, the source positions corresponding to the component locating template.

In a further embodiment, a method of determining gage locations for strain gage components to be mounted on a structural wall having a first side and a second side opposite the first side is provided including marking a plurality of source points on the first side of the structural wall that corresponds to a component locating template, wherein positions of the source points have corresponding clone positions on the second side of the structural wall. The method includes locating the clone positions on the second side of the structural wall by successively positioning a source magnet at the source points on the first side of the structural wall and by correspondingly positioning a clone magnet on the second side of the structural wall such that an attractive magnetic force aligns the clone magnet with the source magnet to determine each of the source positions on the second side of the structural wall. The method includes marking clone points at each of the clone positions on the second side of the structural wall such that the component locating template is mirrored on the second side. The component locating templates on the first and second sides of the structural wall define gage locations on the first and second sides of the structural wall for mounting corresponding strain gage components at the gage locations.

BRIEF DESCRIPTION OF THE DRAWINGS

FIG. 3 illustrates a portion of a first side of a structural wall showing the component locating template without a component.

FIG. 4 illustrates a corresponding portion of a second side of the structural wall showing the component locating template without a component.

FIG. 5 illustrates a portion of the first side of the structural wall showing the component locating template with a component.

FIG. 6 illustrates a corresponding portion of the second side of the structural wall showing the component locating template with a component.

FIG. 7 is a cross-sectional view of a portion of the structural wall showing the components aligned on opposite sides of the structural wall.

DETAILED DESCRIPTION

Figure 1:
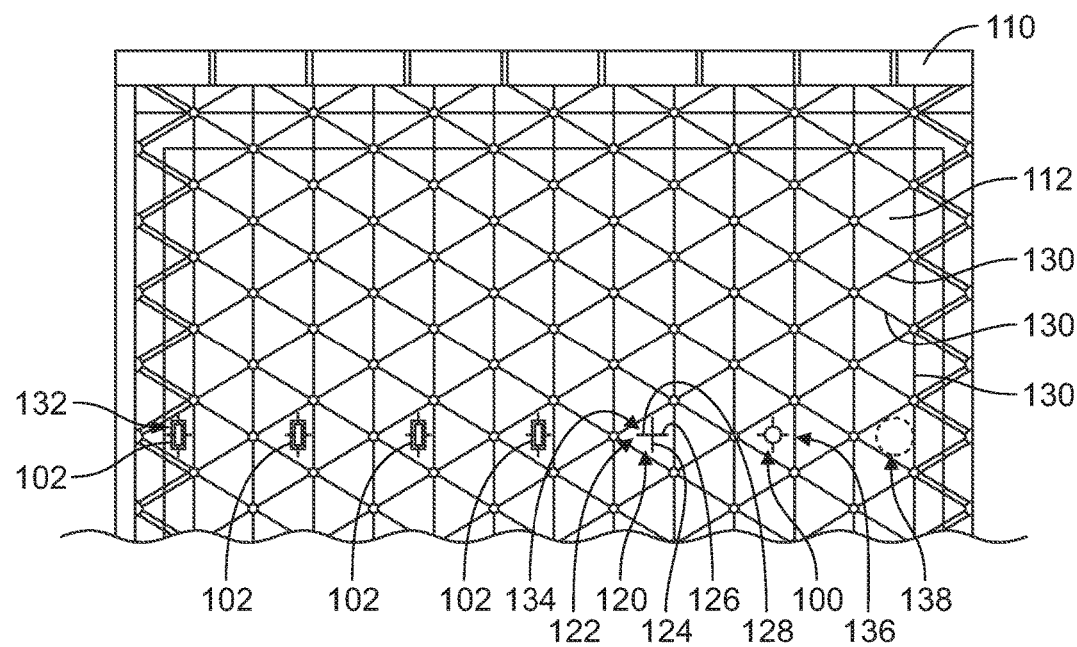
FIG. 1 illustrates a component locating apparatus in accordance with an exemplary embodiment.
Figure 2:
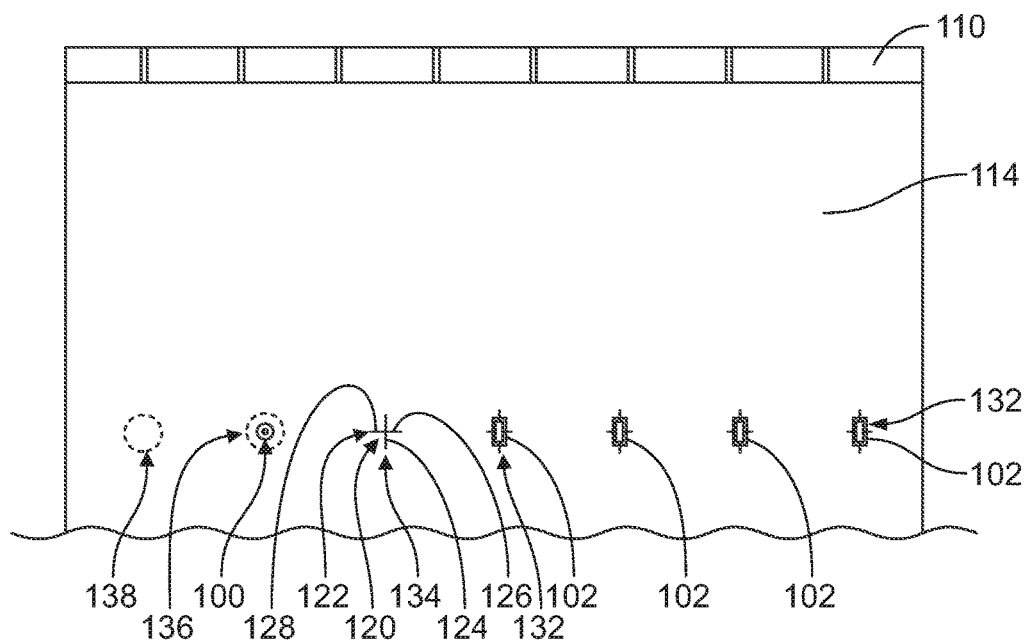
FIG. 2 is a side view illustrating the component locating apparatus in accordance with an exemplary embodiment.

FIG. 1 illustrates a portion of the component locating apparatus 100 in accordance with an exemplary embodiment. FIG. 2 illustrates another portion of the component locating apparatus 100 in accordance with an exemplary embodiment. The component locating apparatus 100 is used for alignment of components 102 to be mounted on opposite sides of a structural wall 110. The structural wall 110 has a first side 112 and a second side 114 opposite the first side 112. FIG. 1 illustrates a portion of the component locating apparatus 100 located relative to the first side 112 of the structural wall 110 and FIG. 2 illustrates another portion of the component locating apparatus 100 located relative to the second side 114 of the structural wall 110.

The component locating apparatus 100 is used during manufacturing to provide markings on the structural wall 110 for precise alignment of the components 102. In an exemplary embodiment, the components 102 are sensors used for monitoring the structural wall 110. For example, the components 102 may be strain gauges, temperature gauges, position sensors, and the like. In various embodiments, having the components aligned on the first and second sides 112, 114 provides more accurate sensing. The component locating apparatus 100 is used for aligning the components 102 on the opposite sides of the structural wall 110. For example, the component locating apparatus 100 may be used for marking locations on the structural wall 110, such as on the first side 112 and/or on the second side 114. Such marked locations are aligned on opposite sides of the structural wall 110 by the component locating apparatus 100.

In an exemplary embodiment, the markings are used to form a component locating template 120 on the structural wall 110. In various embodiments, the component locating template 120 may be applied to or defined on the first side 112 and the component locating apparatus 100 is used to mirror the component locating template 120 on the second side 114. The component locating template 120 is used to define the mounting location for the components 102 to the structural wall 110. For example, the component locating template 120 may define locations for positioning and/or securing the component 102 to the structural wall 110. In various embodiments, the component locating template 120 may include a crosshair 122 having a first line 124 and a second line 126 perpendicular to and intersecting the first line 124 at an intersection 128 to form the crosshair 122. The crosshair 122 is used for vertical locating of the component 102 and for horizontal locating of the component 102. Optionally, the first line 124 may be a vertical line and the second line 126 may be a horizontal line; however, any number of lines may be used in the template 120 and such lines may extend in any direction, including directions other than vertically and horizontally. The component locating template 120 may have other markings, symbols or identifiers in a predetermined pattern for mounting the component 102 to the structural wall 110. The markings may identify mounting locations on the structural wall 110, such as for securing the component 102 using adhesive, fasteners, welding and the like.

The structural wall 110 may be a thick, non-ferrous or composite material wall or panel. The structural wall 110 may be large enough that a single operator is unable to use the component locating apparatus, but rather needs two operators on the opposite sides of the structural wall 110. In an exemplary embodiment, the first side 112 of the structural wall 110 is different than the second side 114 of the structural wall 110. For example, the second side 114 may be generally smooth and devoid of identifying features. Measurement from panel edges or other areas of the second side 114 may be difficult or lead to errors in marking location. As a result, the component locating apparatus 100 is utilized to mirror the component locating template 120 onto the second side 114. The first side 112 may include visible identifying features 130 that may be used for locating the component locating template 120 on the first side 112. For example, the identifying features 130 may be ribs, panels, grooves and the like in a predetermined layout on the first side 112. Optionally, the identifying features 130 may form a grid. The component locating template 120 may be positioned at a predetermined position relative to the identifying features 130. For example, the manufacturer may measure from one or more of the identifying features 130 to locate the component locating template 120. The component locating template 120 may be hand drawn, or otherwise applied, on the structural wall 110 once properly located, such as by locating multiple points and drawing lines through such points. However, without corresponding identifying features on the second side 114 to locate the component locating template, the component locating template 120 is located using the component locating apparatus 100 on the second side 114.

FIGS. 1 and 2 illustrate various components 102 mounted to the structural wall 110 at various locations 132, such as at spaced apart locations along the first and second sides 112, 114. FIGS. 1 and 2 further illustrate a location 134 on the first and second sides 112, 114 having component locating templates 120 applied thereto without the component 102 coupled to the structural wall 110 at such location 134. With the component locating templates 120 aligned on the first and second sides 112, 114 at the location 134, the components 102 are ready to be mounted at the location 134. FIGS. 1 and 2 further illustrate a location 136 having the component locating template 120 on the first side 112 but the second side 114 does not include the component locating template 120. The component locating apparatus 100 is shown at the location 136 for marking and applying the component locating template 120 to the second side 114 at the location 136. FIGS. 1 and 2 further illustrate a location 138 configured to receive components but without component locating templates 120. The operator is able to mark the component locating template 120 on the first side 112 and then use the component locating apparatus 100 at the location 138 to mark the second side 114 for mirroring the component locating template 120 on the second side 114.

FIG. 3 illustrates a portion of the first side 112 of the structural wall 110 showing the component locating template 120 without a component 102 mounted thereto. FIG. 4 illustrates a corresponding portion of the second side 114 of the structural wall 110 showing the component locating template 120 without a component 102 mounted thereto. FIG. 5 illustrates a portion of the first side 112 of the structural wall 110 showing the component locating template 120 with the component 102 mounted thereto. FIG. 6 illustrates a corresponding portion of the second side 114 of the structural wall 110 showing the component locating template 120 with the component 102 mounted thereto. FIG. 7 is a cross-sectional view of a portion of the structural wall 110 showing the components 102 aligned on opposite sides of the structural wall 110.

During manufacture, the component locating template 120 is applied to the first side 112 of the structural wall 110. The component locating apparatus 100 is used during manufacturing to mirror the component locating template 120 on the second side 114 of the structural wall 110. The component locating apparatus 100 is used to locate points on the second side 114 corresponding to the component locating template 120 on the first side 112. The operator provides markings on the second side 114 of the structural wall 110 corresponding to the located points and uses the markings to superimpose the component locating template 120 on the second side 114 of the structural wall 110, such as by drawing lines through the marked points. Such method provides precise alignment of the components 102. The markings may be dots, open circles or other types of markings to identify the located points.

After the component locating templates 120 are aligned on the first and second sides 112, 114, the components 102 may be mounted to the structural wall 110. The assembler uses the component locating templates 120 to properly position the components 102. For example, the component 102 includes alignment marks 140 configured to be aligned with the component locating template 120 to position the component 102. In the illustrated embodiment, the component 102 includes for spaced apart alignment marks 140 that are configured to be aligned with the first line 124 and the second line 126 to properly position the component 102 on the structural wall 110. For example, by aligning the alignment marks 140 with the first and second lines 124, 126, a center of the component 102 may be aligned with the center of the crosshair 122 at the intersection of the first and second lines 124, 126. Because the component locating templates 120 are precisely aligned using the component locating apparatus 100, the components 102 may be precisely aligned.

Figure 8:
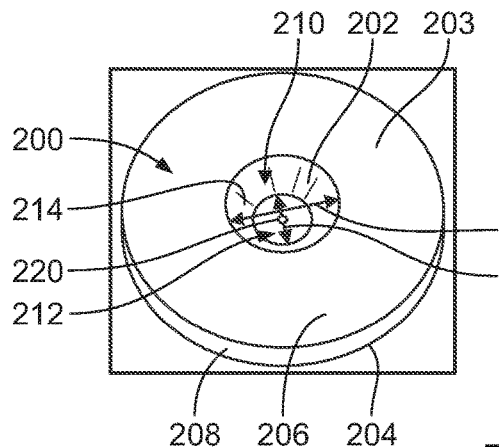
FIG. 8 illustrates the component locating apparatus showing a source magnet and a clone magnet in accordance with an exemplary embodiment.
Figure 8:
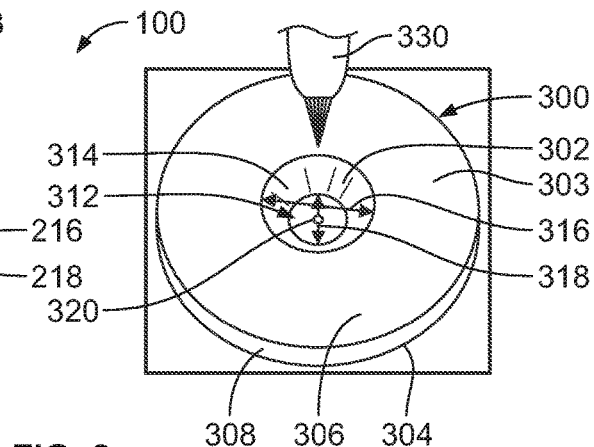

FIG. 8 illustrates the component locating apparatus 100 in accordance with an exemplary embodiment. The component locating apparatus 100 includes a source magnet 200 and a clone magnet 300. The source magnet 200 is configured to be held at the first side 112 of the structural wall 110 at a source position to locate the clone magnet 300 on the second side 114 of the structural wall 110 at a clone position. The clone position of the clone magnet 300 on the second side 114 is dictated by the source position of the source magnet 200 on the first side 112. The clone magnet 300 is used for marking the second side 114 to transfer or clone the component locating template 120 on the second side 114 of the structural wall 110.

The source magnet 200 includes a magnet body 202. In various embodiments, the source magnet 200 includes a protective cover 203 around at least a portion of the magnet body 202. For example, the protective cover 203 may be a coating applied to the magnet body 202. The protective cover 203 provides more grip making the source magnet 200 easier to hold. The protective cover 203 protects the magnet body 202 from damage during handling and use. The source magnet 200 extends between a first side 204 and a second side 206. The first side 204 is configured to face the structural wall 110 and the second side 206 is configured to face away from the structural wall 110. When the protective cover 203 is used and provided along the first side 204, the protective cover 203 may provide higher surface tension against the first side 112 the structural wall 110 to hold the source magnet 200 in place on the first side 112 of the structural wall 110. In an exemplary embodiment, the source magnet 200 is a rare earth magnet.

The source magnet 200 includes one or more edges 208 along the outer perimeter of the source magnet 200. In the illustrated embodiment, the magnet body 202 is cylindrical; however, the magnet body 202 may have other shapes in alternative embodiments, such as rectangular, square, triangular, diamond shaped, oval or another regular or irregular geometric shape. The size, shape and thickness of the source magnet 200 may affect the amount of attractive magnetic force generated by the source magnet 200 for holding the clone magnet 300 on the opposite side of the structural wall 110. Optionally, multiple source magnets 200 may be stacked together to increase the attractive magnetic force, such as when used on a thick structural wall 110. For example, the source magnets 200 may be polarized in the same direction to increase the attractive magnetic force.

The source magnet 200 includes a locating feature 210 for locating the source magnet 200 relative to the component locating template 120 on the first side 112 of the structure wall 110. In the illustrated embodiment, the locating feature 210 includes a locating opening 212 through the source magnet 200. The locating opening 212 allows the operator to visually identify the component locating template 120 through the locating opening 212 for positioning the source magnet 200 on the structural wall 110. In an exemplary embodiment, the locating opening 212 is provided at a magnetic centroid 220 of the source magnet 200. In the illustrated embodiment, the locating opening 212 includes a beveled edge 214 having a larger diameter 216 at the second side 206 and a smaller diameter 218 at the first side 204. The beveled edge 214 allows more light to pass through the locating opening 212 to view the component locating template 120 through the locating opening 212.

The clone magnet 300 includes a magnet body 302. In various embodiments, the clone magnet 300 includes a protective cover 303 around at least a portion of the magnet body 302. For example, the protective cover 303 may be a coating applied to the magnet body 302. The protective cover 303 provides more grip making the clone magnet 300 easier to hold. The protective cover 303 protects the magnet body 302 from damage during handling and use. The clone magnet 300 extends between a first side 304 and a second side 306. The first side 304 is configured to face the structural wall 110 and the second side 306 is configured to face away from the structural wall 110. When the protective cover 303 is used and provided along the first side 304, the protective cover 303 may provide higher surface tension against the second side 114 the structural wall 110 to hold the clone magnet 300 in place on the second side 114 of the structural wall 110. In an exemplary embodiment, the clone magnet 300 is a rare earth magnet.

The clone magnet 300 includes one or more edges 308 along the outer perimeter of the clone magnet 300. In the illustrated embodiment, the magnet body 302 is cylindrical; however, the magnet body 302 may have other shapes in alternative embodiments, such as rectangular, square, triangular, diamond shaped, oval or another regular or irregular geometric shape. The size, shape and thickness of the clone magnet 300 may affect the amount of attractive magnetic force holding the clone magnet 300 on the structural wall 110.

The clone magnet 300 includes a marking opening 312 through the clone magnet 300. The marking opening 312 allows the operator to access the second side 114 of the structural wall 110 behind the clone magnet 300. For example, the marking opening 312 is sized and shaped to receive a writing device 330, such as a pencil or marker for marking the second side 114 of the structural wall 110 at the clone position. The marking may be a dot or circle drawn at the center of the marking opening 312 or another type of marking. In an exemplary embodiment, the marking opening 312 is provided at a magnetic centroid 320 of the clone magnet 300. The attractive magnetic force between the source magnet 200 and the clone magnet 300 aligns the magnetic centroids 220, 320 of the source magnet 200 and the clone magnet 300 on opposite sides of the structural wall 110. Optionally, when positioning the clone magnet 300, the user may hold the magnet in their finger tips and allow the attractive magnetic force to pull the clone magnet 300 out of their fingers to align with the magnetic centroid 220 of the source magnet 200. In this way, the user does not skew the placement of the clone magnet 300. Additionally, by having the clone magnet 300 away from the structural wall 110, friction of the clone magnet sliding along the structural wall 110 will not affect the placement. When the clone magnet 300 is released by the operator and magnetically held against the second side 114 of the structural wall 110 by the source magnet 200, the magnetic centroids 220, 320 are aligned.

In the illustrated embodiment, the locating opening 312 includes a beveled edge 314 having a larger diameter 316 at the second side 306 and a smaller diameter 318 at the first side 304. The beveled edge 314 allows more light to pass through the locating opening 312 to view the second side 114 of the structural wall 110 through the locating opening 312. The beveled edge 314 guides the writing device 330 into the marking opening 312. Alternatively, the clone magnet 300 may be flipped over to reduce the size of the opening that receives the writing device 330 to have a more accurate marked location. The side of the clone magnet 300 that is attracted to the source magnet 200 may depend on the polarity of the magnets 200, 300 and thus the side of the source magnet 200 that is placed against the structural wall 110. In various embodiments, the size of the diameter 318 is chosen as a scale corresponding to an allowable tolerance band of a position of the component locating template 120 on the second side 114 of the structural wall 110. By making the diameter 318 smaller, the mark may be more precisely located on the second side 114 of the structural wall 110.

FIGS. 9-16 illustrate the component locating apparatus 100 being used to transfer the component locating template 120 from the first side 112 of the structural wall 110 to the second side 114 of the structural wall 110 in accordance with an exemplary embodiment. An exemplary method for alignment of the components 102 on opposite sides of the structural wall including applying the component locating template 120 to the first side 112 of the structural wall 110 and then cloning or transferring the component locating template 120 to the second side 114 of the structural wall 110 using the source and clone magnets 200, 300.

In various embodiments, the method includes successively holding the source magnet 200 at a plurality of spaced apart source positions relative to the component locating template 120 on the first side 112 of the structural wall 110. For example, the locating feature 210 of the source magnet 200 is used to locate the source magnet 200 at the various source positions. In various embodiments, when the locating feature 210 is a locating opening 212 aligned with the magnetic centroid 220, the source magnet 200 is positioned by aligning the source position in the locating opening 212 to align the magnetic centroid 220 with the source position.

In various embodiments, the method includes successively positioning the clone magnet 300 at the clone positions on the second side 114 of the structural wall 110 corresponding to the source positions. The attractive magnetic force of the source magnet 200 is used to magnetically hold the clone magnet 300 at the corresponding clone position against the second side 114 of the structural wall 110. For example, the magnetic centroid 320 and the marking opening 312 of the clone magnet 300 are aligned with the magnetic centroid 220 of the source magnet 200 by the attractive magnetic force.

In various embodiments, the method includes marking each of the plurality of clone positions on the second side 114 of the structural wall 110 through the marking opening 312 at the magnetic centroid 320 of the clone magnet 300 to mirror, on the second side 114, the source positions corresponding to the component locating template 120. The operator uses the writing device to mark the clone positions on the second side 114 of the structural wall 110 through the marking opening 312.

In an exemplary embodiment, the source magnet 200 is held at each of the source positions while the clone magnet 300 is positioned and the clone positions are marked before moving the source magnet 200 to the next source position. Any number of clone positions may be marked on the second side 114 of the structural wall 110 depending on the shape of the component locating template 120 and the need for accuracy. Generally, marking more clone locations increases the alignment accuracy of the cloned component locating template 120 on the second side 114 of the structural wall 110.

In various embodiments, the method includes superimposing template lines over the marked clone positions to form the component locating template 120 on the second side 114 of the structural wall 110. For example, the component locating template 120 on the first side 112 may include the crosshair 122 including the first and second lines 124, 126. The source positions correspond to multiple points along each of the two intersecting lines 124, 126 for marking the corresponding clone positions on the second side 114 of the structural wall 110. Once enough clone points are marked on the second side 114 of the structural wall 110, the intersecting template lines are superimposed on the second side 114 of the structural wall 110 to define the component locating template 120 on the second side 114 of the structural wall 110. For example, the user may draw the lines 124, 126 through the clone points marked on the second side 114 of the structural wall 110.

In various embodiments, the method includes verifying the locations of the template lines marked on the second side 114. After the template lines have been drawn, the operator may again use the source magnet 200 and the clone magnet 300 to visually verifying that the template lines on the second side 114 of the structural wall 110 are aligned with the template lines 124, 126 on the first side 112 of the structural wall 110. For example, the source magnet 200 may be positioned at one or more source positions and then the clone magnet 300 is coupled to the opposite side of the structural wall 110 using the attractive magnetic force. The operator verifies that the template lines are visible in the marking opening 312 at one or more verification locations, which may be different than the originally marked locations. If the template line is visible within the marking opening 312, then such template line is within the error band or tolerance allowed. However, if the template line is not visible within the marking opening 312, then the component locating template 120 on the second side 114 is too far out of alignment and needs to be re-located.

Figure 9:
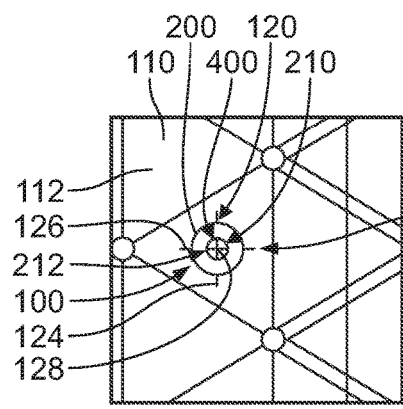
FIG. 9 illustrates the source magnet at a first source position on the structural wall.
Figure 10:
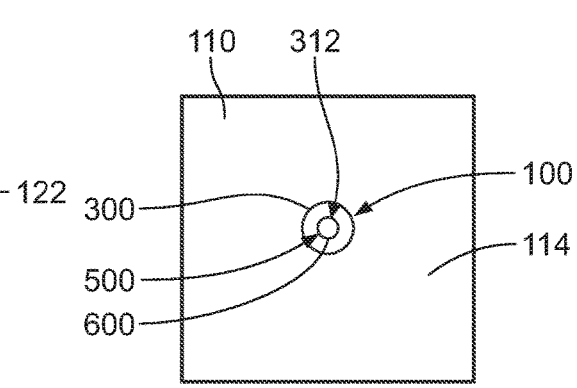
FIG. 10 illustrates the clone magnet at a corresponding clone position on the structural wall.

FIG. 9 illustrates the source magnet 200 at a first source position 400 on the first side 112 of the structural wall 110 and FIG. 10 illustrates the clone magnet 300 at a corresponding clone position 500 on the second side 114 of the structural wall 110. The first source position 400, in the illustrated embodiment, corresponds to the intersection 128 of the first and second lines 124, 126. The intersection 128 is generally centered in the locating opening 212 to align the magnetic centroid 220 of the source magnet 200 with the first source position 400 corresponding to the intersection 128. While the source magnet 200 is held at the first source position 400, the clone magnet 300 is positioned at the second side 114 of the structural wall 110. The attractive magnetic force of the source magnet 200 will align the clone magnet 300 with the source magnet 200 and hold the clone magnet 300 against the second side 114 of the structural wall 110. In an exemplary embodiment, the magnetic centroids 220, 320 are aligned on opposite sides of the structural wall 110. The marking opening 312 is aligned with the magnetic centroid 320 at the clone position 500. Once located, the operator marks a first clone point 600 at the first clone position 500. The operator uses the writing device 330 to make the mark on the second side 114 of the structural wall 110. The shape of the marking opening 312 may determine the shape of the mark. The mark may fill the marking opening 312; however, the mark may be smaller than the marking opening 312, in which case the operator should attempt to center the mark in the marking opening 312. After the mark is made, the clone magnet 300 may be removed and/or the source magnet 200 may be removed. The source magnet 200 may then be moved to a different source point for continuing the marking process.

Figure 11:
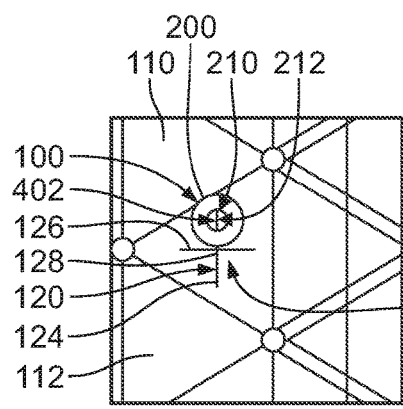
FIG. 11 illustrates the source magnet at a second source position on the structural wall.
Figure 12:
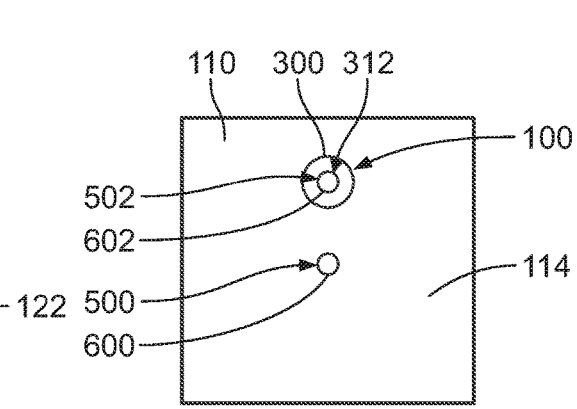
FIG. 12 illustrates the clone magnet at a corresponding clone position on the structural wall.

FIG. 11 illustrates the source magnet 200 at a second source position 402 on the first side 112 of the structural wall 110 and FIG. 12 illustrates the clone magnet 300 at a corresponding second clone position 502 on the second side 114 of the structural wall 110. The second source position 402, in the illustrated embodiment, is a point along the first line 124. Centering the locating opening 212 of the source magnet 200 on the second source position 402 aligns the magnetic centroid 220 of the source magnet 200 with the first line 124. While the source magnet 200 is held at the second source position 402, the clone magnet 300 is positioned at the second side 114 of the structural wall 110. The attractive magnetic force of the source magnet 200 will align the clone magnet 300 with the source magnet 200 and hold the clone magnet 300 against the second side 114 of the structural wall 110. In an exemplary embodiment, the magnetic centroids 220, 320 are aligned on opposite sides of the structural wall 110. The marking opening 312 is aligned with the magnetic centroid 320 at the second clone position 502. Once located, the operator marks a second clone point 602 at the second clone position 502. After the mark is made, the clone magnet 300 may be removed and/or the source magnet 200 may be removed. The source magnet 200 may then be moved to a different source point for continuing the marking process. The source magnet 200 does not necessarily need to be positioned at the second source position 402 immediately after positioning at the first source position 400, but rather could be positioned at the second source position 402 before the first source position 400 or after positioning at other source positions.

Figure 13:
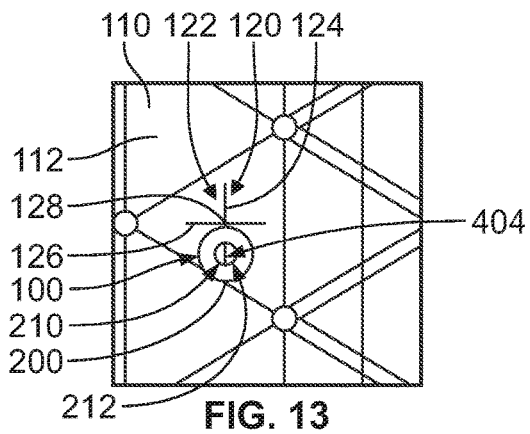
FIG. 13 illustrates the source magnet at a third source position on the structural wall.
Figure 14:
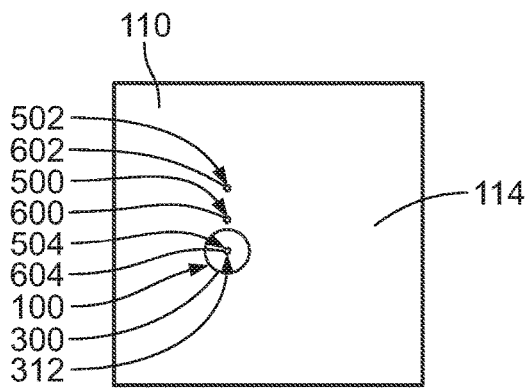
FIG. 14 illustrates the clone magnet at a corresponding clone position on the structural wall.

FIG. 13 illustrates the source magnet 200 at a third source position 404 on the first side 112 of the structural wall 110 and FIG. 14 illustrates the clone magnet 300 at a corresponding third clone position 504 on the second side 114 of the structural wall 110. The third source position 404, in the illustrated embodiment, is a point along the first line 124 on the opposite side of the intersection 128 from the second source position 402 (FIG. 11). Centering the locating opening 212 of the source magnet 200 on the third source position 404 aligns the magnetic centroid 220 of the source magnet 200 with the first line 124. While the source magnet 200 is held at the third source position 404, the clone magnet 300 is positioned at the second side 114 of the structural wall 110. The attractive magnetic force of the source magnet 200 will align the clone magnet 300 with the source magnet 200 and hold the clone magnet 300 against the second side 114 of the structural wall 110. In an exemplary embodiment, the magnetic centroids 220, 320 are aligned on opposite sides of the structural wall 110. The marking opening 312 is aligned with the magnetic centroid 320 at the third clone position 504. Once located, the operator marks a third clone point 604 at the third clone position 504. After the mark is made, the clone magnet 300 may be removed and/or the source magnet 200 may be removed. The source magnet 200 may then be moved to a different source point for continuing the marking process. The source magnet 200 does not necessarily need to be positioned at the third source position 404 immediately after positioning at the second source position 402, but rather could be positioned at the third source position 404 before the second source position 402 or after positioning at other source positions.

Figure 15:
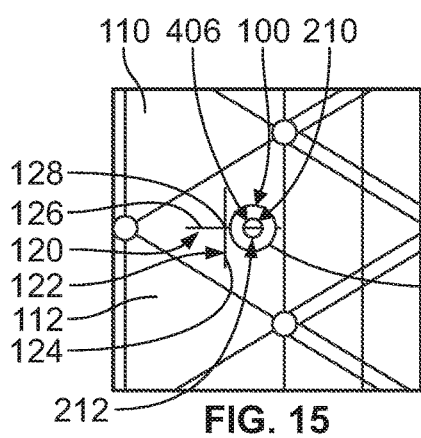
FIG. 15 illustrates the source magnet at a fourth source position on the structural wall.
Figure 16:
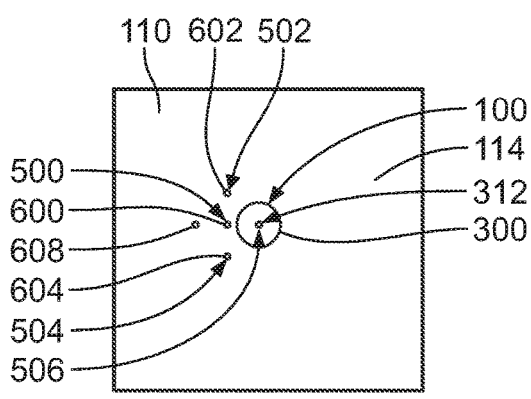
FIG. 16 illustrates the clone magnet at a corresponding clone position on the structural wall.

FIG. 15 illustrates the source magnet 200 at a fourth source position 406 on the first side 112 of the structural wall 110 and FIG. 16 illustrates the clone magnet 300 at a corresponding clone position 506 on the second side 114 of the structural wall 110. The fourth source position 406, in the illustrated embodiment, is a point along the second line 126. Centering the locating opening 212 of the source magnet 200 on the fourth source position 404 aligns the magnetic centroid 220 of the source magnet 200 with the second line 126. While the source magnet 200 is held at the fourth source position 406, the clone magnet 300 is positioned at the second side 114 of the structural wall 110. The attractive magnetic force of the source magnet 200 will align the clone magnet 300 with the source magnet 200 and hold the clone magnet 300 against the second side 114 of the structural wall 110. In an exemplary embodiment, the magnetic centroids 220, 320 are aligned on opposite sides of the structural wall 110. The marking opening 312 is aligned with the magnetic centroid 320 at the fourth clone position 506. Once located, the operator marks a fourth clone point 606 at the fourth clone position 506. The fourth clone point 606 may be positioned on an opposite side of the first clone point 600 from a fifth clone point 608. After the mark is made, the clone magnet 300 may be removed and/or the source magnet 200 may be removed. The source magnet 200 may then be moved to a different source point for continuing the marking process. The source magnet 200 does not necessarily need to be positioned at the fourth source position 406 immediately after positioning at the third source position 404, but rather could be positioned at the fourth source position 406 before the third source position 404 or after positioning at other source positions.

Once enough clone points are marked on the second side 114 of the structural wall 110, intersecting template lines may be superimposed on the second side 114 of the structural wall 110 to define the component locating template 120 on the second side 114 of the structural wall 110. For example, the user may draw lines through the clone points 600, 602, 604, 606, 608 marked on the second side 114 of the structural wall 110. For example, a line connecting the second and third clone points 602, 604 passes through the first clone point 600 and a line connecting the fourth and fifth clone points 606, 608 passes through the first clone point 600. Optionally, additional clone points may be located on each of the lines. Optionally, additional clone points may be located on additional lines.

Figure 17:
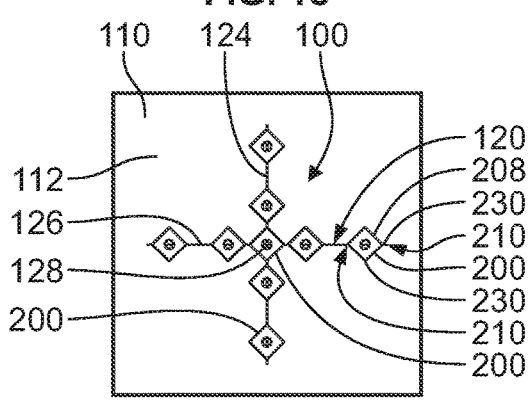
FIG. 17 illustrates the component locating apparatus in accordance with an exemplary embodiment.
Figure 18:
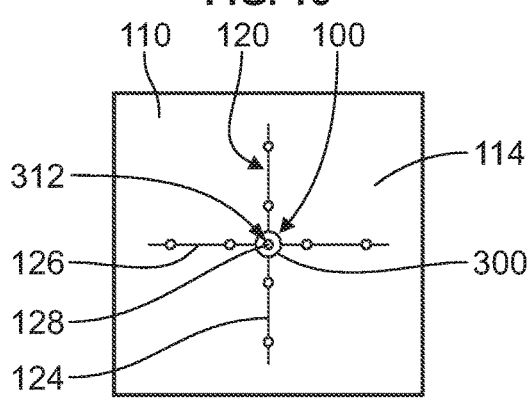
FIG. 18 illustrates the component locating apparatus in accordance with an exemplary embodiment.

FIG. 17 illustrates the component locating apparatus 100 in accordance with an exemplary embodiment showing a plurality of source magnets 200 coupled to the first side 112 of the structural wall 110. FIG. 18 illustrates the component locating apparatus 100 in accordance with an exemplary embodiment showing the clone magnet 300 coupled to the second side 112 of the structural wall 110 showing clone points marked on the second side 114 and showing the template lines 124, 126 drawn on the second side 114. In lieu of using a plurality of source magnets 200 at the same time, a single source magnet 200 may be used and successively moved to various locations, such as the locations shown in FIG. 17.

In an exemplary embodiment, the various source magnets 200 may be ganged together by a holding member that physically ties the source magnets 200 together in a predetermined shape, such as the cross-shape shown in FIG. 17; however, the source magnets 200 may be arranged in other patterns to correspond with differently shaped component locating templates 120. The source magnets 200 shown in FIG. 17 are square shaped rather than being circular shaped. Each source magnet 200 has four edges 208 meeting at corners 230. In an exemplary embodiment, the corners 230 define locating features 210 of the source magnet 200. For example, the corners 230 may be aligned with corresponding lines 124 and/or 126 to center the source magnet 200 along the first line 124 and/or the second line 126. The source magnet 200 at the intersection 128 of the first and second lines 124, 126 may have each corner 230 aligned with the corresponding lines 124, 126 to align the magnetic centroid 220 of the source magnet 200 with the intersection 128 of the first and second lines 124, 126. The other source magnets 200 only have two opposite corners 230 aligned with the corresponding line 124 or 126. Even through the source magnet 200 and the clone magnet 300 have different shapes, the magnetic centroids 220, 320 will still be aligned. The clone magnet 300 may have a square shape in alternative embodiments. Optionally, multiple clone magnets 300 may be provided and attached to the second side 114 of the structural wall 110 at the same time. In other various embodiments, rather than using multiple source magnets 200, the component locating apparatus 100 may utilize a single source magnet 200, which may be positionable at the multiple source positions shown in FIG. 17, or other source positions.

As shown in FIG. 18, the clone magnet 300 may be attached to the structural wall 110 after the template lines 124, 126 are marked on the second side 114. For example, the clone magnet 300 may be used to verify alignment of the location of the component locating template 120 on the second side 114. The user magnetically attaches the clone magnet 300 at various verification locations along the template lines 124, 126 to verify that the template lines 124, 126 on the second side 114 are aligned with the template lines 124, 126 on the first side 112. For example, if the template lines 124, 126 are visible in the marking opening 312, then the template lines 124, 126 are within an allowable tolerance of alignment.

Figure 19:
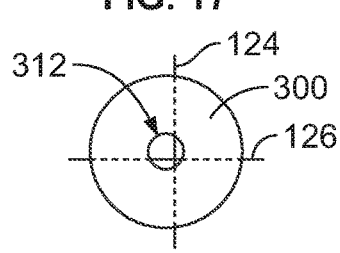
FIG. 19 illustrates the component locating apparatus in accordance with an exemplary embodiment.
Figure 20:
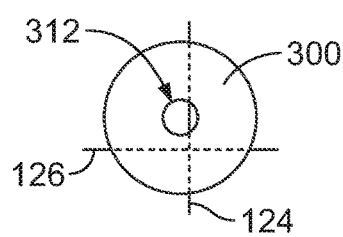
FIG. 20 illustrates the component locating apparatus in accordance with an exemplary embodiment.

FIG. 19 illustrates the component locating apparatus 100 in accordance with an exemplary embodiment showing the clone magnet 300 coupled to the second side 112 of the structural wall 110 for verification of the location of the template lines 124, 126. FIG. 20 illustrates the component locating apparatus 100 in accordance with an exemplary embodiment showing the clone magnet 300 coupled to the second side 112 of the structural wall 110 for verification of the location of the template lines 124, 126. FIG. 19 shows the template lines 124, 126 in compliance. Both template lines 124, 126 are visible in the marking opening 312. FIG. 20 shows the template line 124 in compliance and the template line 126 out of compliance. Only the first template line 124 is visible in the marking opening 312, whereas the second template line 126 is outside of the marking opening 312. In an exemplary embodiment, the marking opening 312 is scaled to coincide with the allowable tolerance for the verification step.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A component locating apparatus for alignment of components to be mounted on opposite sides of a structural wall, the structural wall having a first side and a second side opposite the first side, the first side having a component locating template for locating at least one component on the first side, the component locating apparatus comprising:
   a source magnet having a locating feature, the source magnet being a rare earth magnet, the source magnet having a magnetic centroid positioned at a predetermined location relative to the locating feature, the source magnet having a first side configured to be successively held against the first side of the structural wall at a plurality of spaced apart source positions relative to the component locating template, the locating feature being used to locate the source magnet at the spaced apart source positions; and
   a clone magnet having a magnetic centroid and a marking opening at the magnetic centroid of the clone magnet, the clone magnet being a rare earth magnet, the clone magnet having a first side configured to be magnetically held against the second side of the structural wall by an attractive magnetic force of the source magnet at a plurality of clone positions corresponding to the plurality of source positions, the magnetic centroid and the marking opening of the clone magnet being aligned with the magnetic centroid of the source magnet by the attractive magnetic force;
   wherein the marking opening allows an operator to mark the second side of the structural wall at the magnetic centroid of the clone magnet at each of the clone positions to mirror, on the second side, the source positions corresponding to the component locating template.

2. The component locating apparatus of claim 1, wherein the locating feature is at the magnetic centroid of the source magnet.

3. The component locating apparatus of claim 1, wherein the locating feature is at an edge of the source magnet remote from the magnetic centroid.

4. The component locating apparatus of claim 1, wherein the source magnet includes a plurality of locating features configured to be positioned along the component locating template to align the magnetic centroid of the source magnet with the corresponding source position on the component locating template.

5. The component locating apparatus of claim 1, wherein the locating feature comprises a locating opening through the source magnet, the locating opening configured to allow the operator to view the component locating template through the locating opening.

6. The component locating apparatus of claim 1, wherein the marking opening is scaled to correspond to an allowable tolerance band of a position of the component locating template on the second side of the structural wall.

7. The component locating apparatus of claim 1, wherein the marking opening includes beveled edges such that the marking opening is larger at a second side of the clone magnet and smaller at the first side of the clone magnet.

8. The component locating apparatus of claim 1, wherein the marking opening is sized and shaped to receive a writing device for marking the second side of the structural wall.

9. The component locating apparatus of claim 1, wherein the source magnet includes a protective cover around the rare earth magnet and the clone magnet includes a protective cover around the rare earth magnet.

10. The component locating apparatus of claim 1, wherein the component locating template includes a crosshair having a first line and a second line perpendicular to and intersecting the first line, the source magnet being positionable at at least two source positions along the first line and at at least two source positions along the second line to correspondingly position the clone magnet at the corresponding clone positions to reproduce the crosshair on the second side of the structural wall.

11. The component locating apparatus of claim 10, wherein the source magnet is positionable at the source position corresponding to the intersection of the first line and the second line to position the clone magnet at the clone position corresponding to the center of the crosshair of the component locating template.

12. A method for alignment of components to be mounted on opposite sides of a structural wall having a first side and a second side opposite the first side, the first side having a component locating template for locating at least one component on the first side, the method comprising:
   successively holding a source magnet at a plurality of spaced apart source positions relative to the component locating template on the first side of the structural wall, the source magnet having a locating feature and a magnetic centroid positioned at a predetermined location relative to the locating feature, the locating feature being used to locate the source magnet at the spaced apart source positions; and
   successively positioning a clone magnet at a plurality of clone positions on the second side of the structural wall corresponding to the plurality of source positions using an attractive magnetic force of the source magnet, the clone magnet having a magnetic centroid and a marking opening at the magnetic centroid of the clone magnet, the magnetic centroid and the marking opening of the clone magnet being aligned with the magnetic centroid of the source magnet by the attractive magnetic force; and
   marking each of the plurality of clone positions on the second side of the structural wall through the marking opening at the magnetic centroid of the clone magnet to mirror, on the second side, the source positions corresponding to the component locating template.

13. The method of claim 12, wherein the source positions correspond to multiple points along each of two intersecting template lines of the component locating template for marking the corresponding clone positions on the second side of the structural wall to superimpose intersecting template lines on the second side of the structural wall to define the component locating template on the second side of the structural wall.

14. The method of claim 12, wherein the source magnet is held at each of the source positions while the clone magnet is positioned and the clone positions are marked before moving the source magnet to the next source position.

15. The method of claim 12, wherein the component locating template includes a crosshair having a first line and a second line perpendicular to and intersecting the first line, said holding the source magnet comprises holding the source magnet at a first source position along the first line and a second source position along the first line to position the clone magnet at corresponding first and second clone positions for marking the first and second clone positions for reproducing a mirrored version of the first line on the second side of the structural wall and said holding the source magnet comprises holding the source magnet at a third source position along the second line and a fourth source position along the second line to position the clone magnet at corresponding third and fourth clone positions for marking the third and fourth clone positions for reproducing a mirrored version of the second line on the second side of the structural wall.

16. The method of claim 15, wherein said holding the source magnet comprises holding the source magnet at a fifth source position at the intersection of the first line and the second line to position the clone magnet at a corresponding fifth clone position for marking the fifth clone position for identifying an intersection of the first line and the second line on the second side of the structural wall.

17. The method of claim 12, wherein said positioning the clone magnet comprises magnetically holding the clone magnet against the second side of the structural wall using the attractive magnetic force.

18. The method of claim 12, wherein said marking each of the plurality of clone positions comprises using a writing device to mark the clone positions on the second surface of the structural wall through the marking opening.

19. The method of claim 12, further comprising superimposing template lines over the marked clone positions to form the component locating template on the second side of the structural wall.

20. The method of claim 19, further comprising verifying the locations of the template lines using the source magnet and the clone magnet by visually verifying that the template lines on the second side of the structural wall are visible in the marking opening at multiple verification locations.

21. The method of claim 12, wherein the locating feature of the source magnet includes a locating opening at the magnetic centroid of the source magnet, said holding the source magnet comprises aligning the source position in the locating opening to align the magnetic centroid with the source position.

22. The method of claim 12, wherein the component locating template includes a crosshair having a first line and a second line perpendicular to and intersecting the first line, the source magnet being square having four corners, the locating feature comprising the four corners, said holding the source magnet comprises aligning the four corners with the first and second lines to align the magnetic centroid of the source magnet with the intersection of the first and second lines to position the clone magnet and mark the clone position corresponding to a center of the component locating template on the second side of the structural wall.

23. A method of determining gage locations for strain gage components to be mounted on a structural wall having a first side and a second side opposite the first side, the method comprising:
  marking a plurality of source points on the first side of the structural wall that corresponds to a component locating template, wherein positions of the source points have corresponding clone positions on the second side of the structural wall;
  locating the clone positions on the second side of the structural wall by successively positioning a source magnet at the source positions on the first side of the structural wall and by correspondingly positioning a clone magnet on the second side of the structural wall such that an attractive magnetic force aligns the clone magnet with the source magnet to determine each of the clone positions on the second side of the structural wall; and
  marking clone points at each of the clone positions on the second side of the structural wall such that the component locating template is mirrored on the second side;
  wherein the component locating templates on the first and second sides of the structural wall define gage locations on the first and second sides of the structural wall for mounting corresponding strain gage components at the gage locations.

24. The method of claim 23, wherein said locating the clone positions comprises successively holding the source magnet at a plurality of the spaced apart source positions relative to the component locating template on the first side of the structural wall, the source magnet having a locating feature and a magnetic centroid positioned at a predetermined location relative to the locating feature, the locating feature being used to locate the source magnet at the spaced apart source positions and successively positioning the clone magnet at the clone positions on the second side of the structural wall corresponding to the plurality of source positions, the clone magnet having a magnetic centroid and a marking opening at the magnetic centroid of the clone magnet, the magnetic centroid and the marking opening of the clone magnet being aligned with the magnetic centroid of the source magnet by the attractive magnetic force, and said marking the clone positions comprises marking each of the plurality of clone positions on the second side of the structural wall through the marking opening at the magnetic centroid of the clone magnet to mirror, on the second side, the source positions corresponding to the component locating template.

* * * * *